US007432533B2

(12) United States Patent
Auch et al.

(10) Patent No.: US 7,432,533 B2
(45) Date of Patent: Oct. 7, 2008

(54) ENCAPSULATION OF ELECTRONIC DEVICES WITH SHAPED SPACERS

(75) Inventors: Mark Auch, Nanyang Crescent (SG);
Ewald Guenther, Mt Sinai Rise (SG);
Soo Jin Chua, Cheng Soon Crescent (SG)

(73) Assignees: Osram GmbH, Munich (DE); Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/065,254

(22) Filed: Sep. 30, 2002

(65) Prior Publication Data

US 2003/0160318 A1    Aug. 28, 2003

Related U.S. Application Data

(63) Continuation-in-part of application No. 09/989,362, filed on Nov. 20, 2001, now Pat. No. 7,394,153, which is a continuation-in-part of application No. PCT/SG99/00143, filed on Dec. 17, 1999.

(51) Int. Cl.
*H01L 27/15* (2006.01)
*H01L 29/161* (2006.01)
*H01L 29/22* (2006.01)
*H01J 1/622* (2006.01)

(52) U.S. Cl. ............................ 257/81; 257/84; 257/91; 257/10; 257/684; 257/690; 257/704; 257/E23.193; 257/E23.194; 313/506; 313/512

(58) Field of Classification Search .................. 257/40, 257/730, 704, 738, 737, 79, 81, 84, 91, 99, 257/100, 428, 678–734, 778, E23.001, E23.194, 257/E21.503, E21.504, E21.511; 313/512, 313/498, 506; 427/469
See application file for complete search history.

(56) References Cited

U.S. PATENT DOCUMENTS

| 4,253,741 A | 3/1981 | Nakauchi et al. |
| 4,640,584 A | 2/1987 | Tsubakimoto et al. |
| 4,811,081 A | 3/1989 | Lyden |
| 4,842,946 A | 6/1989 | Foust et al. |
| 4,961,962 A | 10/1990 | Morimoto .................. 427/180 |

(Continued)

FOREIGN PATENT DOCUMENTS

DE        3716856       12/1988

(Continued)

OTHER PUBLICATIONS

Donald J. Hayes, W. Royall Cox, Michael E.Grove; "Low-Cost Display Assembly and Interconnect Using Ink-Jet Printing Technology"; Journal of the SID Sep. 1, 2001; pp. 9-13.

(Continued)

*Primary Examiner*—Jasmine J Clark
(74) *Attorney, Agent, or Firm*—Fish & Richardson P.C.

(57) ABSTRACT

An encapsulation for a device is disclosed. Spacer particles are randomly located in the device region to prevent a cap mounted on the substrate from contacting the active components, thereby protecting them from damage. The spacer particles comprise a base and an upper portion, the base being at least equal to or wider than the upper portion, for preventing the generation of dark spots around the spacer particles.

35 Claims, 10 Drawing Sheets

U.S. PATENT DOCUMENTS

| | | | |
|---|---|---|---|
| 5,041,395 A | 8/1991 | Steffen | |
| 5,188,280 A | 2/1993 | Nakao et al. | |
| 5,385,499 A | 1/1995 | Ogawa et al. | 445/24 |
| 5,399,805 A | 3/1995 | Tyler et al. | |
| 5,467,253 A | 11/1995 | Heckman et al. | |
| 5,486,941 A | 1/1996 | Saiuchi et al. | |
| 5,550,408 A | 8/1996 | Kunitomo et al. | 257/737 |
| 5,552,913 A | 9/1996 | Shimizu et al. | 359/80 |
| 5,577,319 A | 11/1996 | Knecht | |
| 5,580,619 A | 12/1996 | Sakai et al. | |
| 5,610,742 A | 3/1997 | Hinata et al. | |
| 5,632,663 A | 5/1997 | Ishihara et al. | |
| 5,687,465 A | 11/1997 | Hinata et al. | |
| 5,693,956 A | 12/1997 | Shi et al. | |
| 5,714,838 A | 2/1998 | Haight et al. | |
| 5,724,230 A | 3/1998 | Poetzinger | 361/758 |
| 5,750,258 A | 5/1998 | Sakai et al. | 428/405 |
| 5,777,386 A | 7/1998 | Higashi et al. | 257/737 |
| 5,804,917 A | 9/1998 | Takahashi et al. | |
| 5,811,177 A | 9/1998 | Shi et al. | |
| 5,821,692 A | 10/1998 | Rogers et al. | |
| 5,844,315 A | 12/1998 | Melton et al. | 257/738 |
| 5,900,675 A | 5/1999 | Appelt et al. | 257/778 |
| 5,909,081 A | 6/1999 | Eida et al. | |
| 5,920,080 A | 7/1999 | Jones | |
| 5,939,783 A | 8/1999 | Laine et al. | 257/702 |
| 5,949,184 A * | 9/1999 | Ohoshi et al. | 313/485 |
| 5,964,030 A | 10/1999 | Lee et al. | |
| 5,965,907 A | 10/1999 | Huang et al. | |
| 6,022,583 A | 2/2000 | Falcone et al. | |
| 6,111,355 A | 8/2000 | Inoue et al. | 313/506 |
| 6,111,356 A | 8/2000 | Roitman et al. | |
| 6,111,357 A | 8/2000 | Fleming et al. | |
| 6,124,918 A | 9/2000 | Park et al. | |
| 6,156,669 A | 12/2000 | Knappenberger | |
| 6,166,489 A | 12/2000 | Thompson et al. | |
| 6,172,879 B1 | 1/2001 | Cilia et al. | 361/778 |
| 6,177,729 B1 | 1/2001 | Benenati et al. | 257/738 |
| 6,184,959 B1 | 2/2001 | Izumi | |
| 6,198,220 B1 | 3/2001 | Jones et al. | |
| 6,210,815 B1 | 4/2001 | Ooishi | |
| 6,219,126 B1 | 4/2001 | Von Gutfeld | |
| 6,222,603 B1 | 4/2001 | Sakai et al. | |
| 6,232,667 B1 | 5/2001 | Hultmark et al. | 257/777 |
| 6,259,204 B1 | 7/2001 | Ebisawa et al. | |
| 6,260,264 B1 | 7/2001 | Chen et al. | 29/832 |
| 6,284,342 B1 | 9/2001 | Ebisawa et al. | |
| 6,309,502 B1 | 10/2001 | Hiroshige et al. | |
| 6,313,528 B1 | 11/2001 | Solberg | 257/686 |
| 6,339,254 B1 | 1/2002 | Venkateshwaran et al. | 257/686 |
| 6,364,196 B1 | 4/2002 | Wood et al. | |
| 6,376,917 B1 | 4/2002 | Takeshita et al. | 257/778 |
| 6,399,004 B1 | 6/2002 | Slager | |
| 6,569,706 B2 * | 5/2003 | Pakbaz et al. | 438/99 |
| 6,580,090 B2 * | 6/2003 | Barth et al. | 257/40 |
| 6,621,173 B1 | 9/2003 | Yamakawa et al. | |
| 6,633,124 B2 | 10/2003 | Himeshima et al. | 313/506 |
| 6,649,221 B1 | 11/2003 | Tateno et al. | 427/469 |
| 6,650,392 B2 | 11/2003 | Iwanaga et al. | |
| 6,734,942 B2 | 5/2004 | Takeuchi | |
| 6,791,660 B1 | 9/2004 | Hayashi et al. | |
| 6,888,237 B1 | 5/2005 | Guenther | |
| 6,888,308 B1 | 5/2005 | Guenther | |
| 6,949,880 B1 | 9/2005 | Guenther et al. | |
| 6,952,078 B1 | 10/2005 | Guenther | |
| 7,166,007 B2 | 1/2007 | Auch et al. | |
| 2002/0125484 A1 * | 9/2002 | Silvernail et al. | 257/79 |
| 2003/0062518 A1 | 4/2003 | Auch et al. | |
| 2003/0094691 A1 | 5/2003 | Auch et al. | 257/704 |
| 2004/0217703 A1 | 11/2004 | Wittmann et al. | |

FOREIGN PATENT DOCUMENTS

| | | | |
|---|---|---|---|
| EP | 0 884 792 A1 | 12/1998 | |
| EP | 0 910 228 A1 | 4/1999 | |
| EP | 0986112 | 3/2000 | |
| EP | 1021070 | 7/2000 | |
| JP | 58160927 | 9/1983 | |
| JP | 60-122919 A | 7/1985 | |
| JP | 3-171643 * | 7/1991 | 228/180.22 |
| JP | 04090512 | 3/1992 | |
| JP | 04136916 | 5/1992 | |
| JP | 09097679 | 4/1997 | |
| JP | 11176571 | 7/1999 | |
| WO | WO 98/28767 | 7/1998 | |
| WO | WO 98/28947 | 7/1998 | |
| WO | WO98/28947 A1 | 7/1998 | |
| WO | WO 98/59528 | 12/1998 | |
| WO | WO98/59528 A1 | 12/1998 | |
| WO | WO 00/16361 | 3/2000 | |
| WO | WO 00/16362 | 3/2000 | |
| WO | WO00/69002 A1 | 11/2000 | |
| WO | WO 01/04938 A1 | 1/2001 | |
| WO | WO 01/04963 | 1/2001 | |
| WO | WO 01/39174 A1 | 5/2001 | |
| WO | WO01/44865 A1 | 6/2001 | |
| WO | WO 01/44865 A1 | 6/2001 | |
| WO | WO01/44866 A1 | 6/2001 | |
| WO | WO 01/45140 A2 | 6/2001 | |
| WO | WO 02/21557 | 3/2002 | |
| WO | WO 03/030272 | 4/2003 | |

OTHER PUBLICATIONS

Bahadur B., "Liquid Crystals: Applications and Uses", 1990, London, vol. 1, pp. 171-194, 397-436; ISBN 9810201109 (Book).

Burroughes et al., "Light-Emitting Diodes Based on Conjugated Polymers", Nature International Weekly of Science, vol. 347, No. 6292, Oct. 4, 1990, p. 539-541.

Cheang, P. et al. "An Optimized Process for Ultrathick Photosensitive Polyimide Applications", SEMICON Taiwan 1996.

Final Office Action mailed Oct. 20, 2006, U.S. Appl. No. 09/968,167.

Burroughs et al., "Light-emitting diodes based on conjugated polymers", Oct. 11, 1990, Nature, London, vol. 347, 1190, pp. 539-541.

* cited by examiner

ENCAPSULATION OF ELECTRONIC DEVICES WITH SHAPED SPACERS

CROSS REFERENCE TO RELATED APPLICATIONS

This application is a continuation-in-part of patent application titled "Encapsulation of Electronic Devices", U.S. Ser. No. 09/989,362 filed as Nov. 20, 2001 now U.S. Pat. No. 7,394,153, which is herein incorporated by reference for all purposes and which is a continuation-in-part of International Application Serial No. PCT/SG99/00143, filed Dec. 17, 1999.

BACKGROUND OF INVENTION

Figure 1:
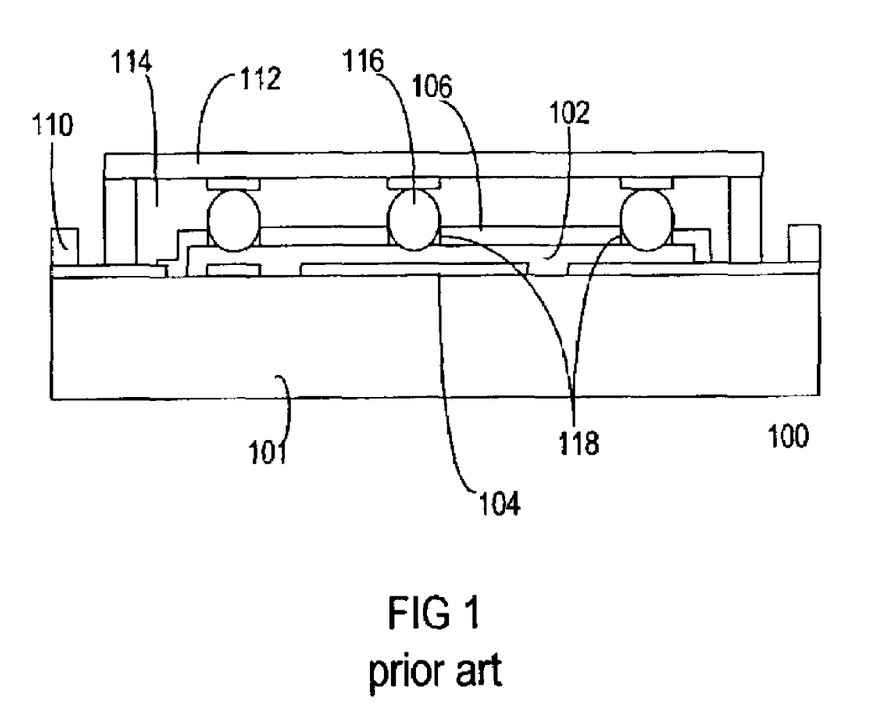
FIG. 1 shows an OLED device.

FIG. 1 shows an OLED device 100. The OLED device comprises a substrate 101, and one or more organic functional layers 102 formed between first and second electrodes 104 and 106. The electrodes can be patterned to form, for example, a plurality of OLED cells to create a pixelated OLED device. OLED cells are located in the device region where the cathodes and anodes overlap. Bond pads 110, which are coupled to the first and second electrodes, are provided to enable electrical connections to the OLED cells.

To protect the OLED cells from components of the environment such as moisture and/or air, a cap 112 encapsulates the device. The active materials of the OLED cells are sensitive and can be easily damaged due to mechanical contact with, for example, the cap. To prevent damage to the OLED cells, a cap or package is used. The cavity package provides a cavity 114 between the cap and OLED cells. The cavity also allows for the placement of desiccant materials to cope with finite leakage rate of the device.

The demand for thin and flexible devices requires the use of thinner components, such as the cap and the substrate. Decreasing the thickness of the cap reduces its mechanical stability, making it more prone to bending which can cause the cavity to collapse, thereby damaging the OLED cells. Spacer particles 116 are provided in the device region to prevent the cap from contacting the active components, thereby protecting them from damage.

However, the spherical shape of spacer particles exposes the edges of the electrode layer 106 in regions such as 118, to reaction with atmospheric components such as moisture and gases (e.g. oxygen). The penetration of atmospheric components into the interior of the OLED may result in the formation of impurities at the electrode-organic material interface. These impurities may cause separation of the electrode from the organic layer. Dark, non-emitting spots may appear at the areas of separation around the spacer particles due to the lack of current flow.

As evidenced from the foregoing discussion, it is therefore desirable to provide an OLED device having improved packaging, particularly those formed on thin or flexible substrates.

SUMMARY OF INVENTION

The invention relates to encapsulation for devices, such as OLED devices. A cap is mounted on the substrate to encapsulate the device, forming a cavity over a device region to protect the active components from contact with the cap.

In accordance with the invention, spacer particles are provided in the device region to support the cap. The spacer particles are shaped to prevent the generation of dark spots around the spacer particles. The spacer particles comprise a base and an upper portion, the base being at least equal to or wider than the upper portion. In one embodiment, the spacer particles comprise a half-spherical shape. Spacer particles comprising other shapes such as pyramidal, cubical, prism, or other regular or irregular shapes, in which the base is at least equal to or wider than the upper portion, are also useful.

DETAILED DESCRIPTION

Figure 2:
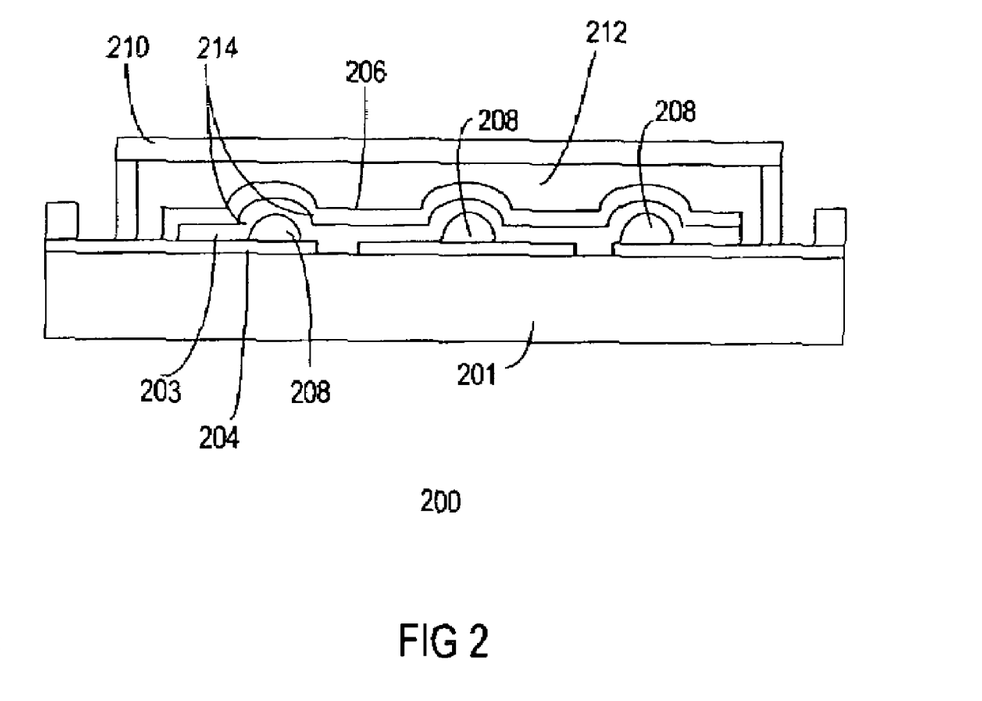
FIG. 2 shows one embodiment of the invention.

In one embodiment, the substrate is about 20-300 µm thick. In some cases, the thin substrate may be mechanically unstable, creating processing problems. A temporary support layer (not shown) can be employed to stabilize the substrate during the fabrication process. The temporary support layer, for example, can be provided on the backside of the substrate. In one embodiment, the temporary support layer comprises a polymer foil coated with an adhesive for attaching to the substrate. After processing, the temporary layer is removed since the device package can be used to mechanically stabilize the device.

The OLED cells comprise one or more organic layers 203 sandwiched between lower and upper electrodes. In one embodiment, the lower electrodes 204 are anodes and the upper electrodes 206 are cathodes. Forming lower electrodes that are cathodes and upper electrodes that are anodes is also useful. In one embodiment, the electrodes are patterned as strips in, for example, passive-matrix display applications. Typically, the upper and lower electrodes are patterned in first and second directions that are orthogonal to each other. The intersections of the upper and lower electrodes form the OLED cells. The cells are addressed by activating the corresponding rows and columns. Alternatively, the OLED display comprises an active-matrix. The active-matrix display comprises cells that are individually addressed by thin-film-transistors (TFTs) and capacitors formed on an electronic backplane.

A cap 210 is provided to seal the device. The cap, in one embodiment, comprises glass. Other materials, such as metal, ceramic or plastics, can also be used. The cap forms a cavity 212 that prevents damage to OLED cells caused by, for example, mechanical contact with the cap.

In accordance with one embodiment of the invention, spacer particles 208 are deposited on the substrate to prevent the cap from contacting the active components. The spacer particles are shaped to prevent the growth of dark and non-emitting spots around the particles. In one embodiment, the spacer particles comprise a base and an upper portion, the base being at least equal to or larger than the upper portion. The profile of the particles prevents regions such as 214 from being exposed to potentially deleterious components (e.g. water and oxygen) that are present in the device. In one embodiment, the spacer particles comprise a half-spherical shape, as shown in FIG. 2. To avoid causing shorts between the electrodes, the spacer particles preferably comprise a non-conductive material. In one embodiment, the spacer particles are made of glass. Spacer particles made of other types of non-conductive materials, such as silica, polymers, ceramic or photoresist, are also useful.

The average diameter of the spacer particles is preferably sufficient to maintain the desired height of the cavity, which is, for example, about 2 50 µm. The distribution of the spacer particles is preferably sufficient to ensure proper separation between the cap and OLED cells when mechanical pressure is applied to the device, without affecting the emission uniformity of the cells. The distribution may be varied to accommodate design requirements, such as the thickness of the cap, thickness of the substrate, and amount of device flexibility needed. Preferably, the distribution of the spacer particles should be selected such that their influence on the emission uniformity is invisible to the unaided human eye. In one embodiment, the density of the spacer particle distribution is about 10 1000 No/mm$^2$. Typically, the average distance between spacer particles is about 100 500 µm.

Figure 3A:
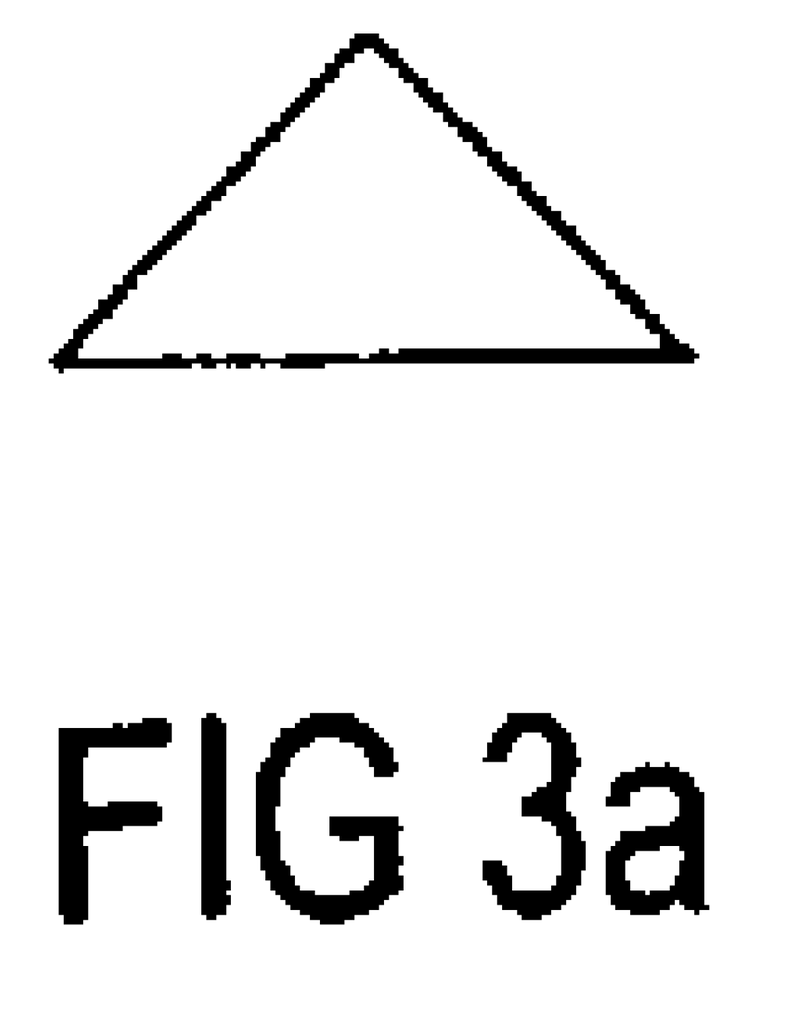
FIGS. 3a-c show spacer particles according to different embodiments of the invention.
Figure 3B:
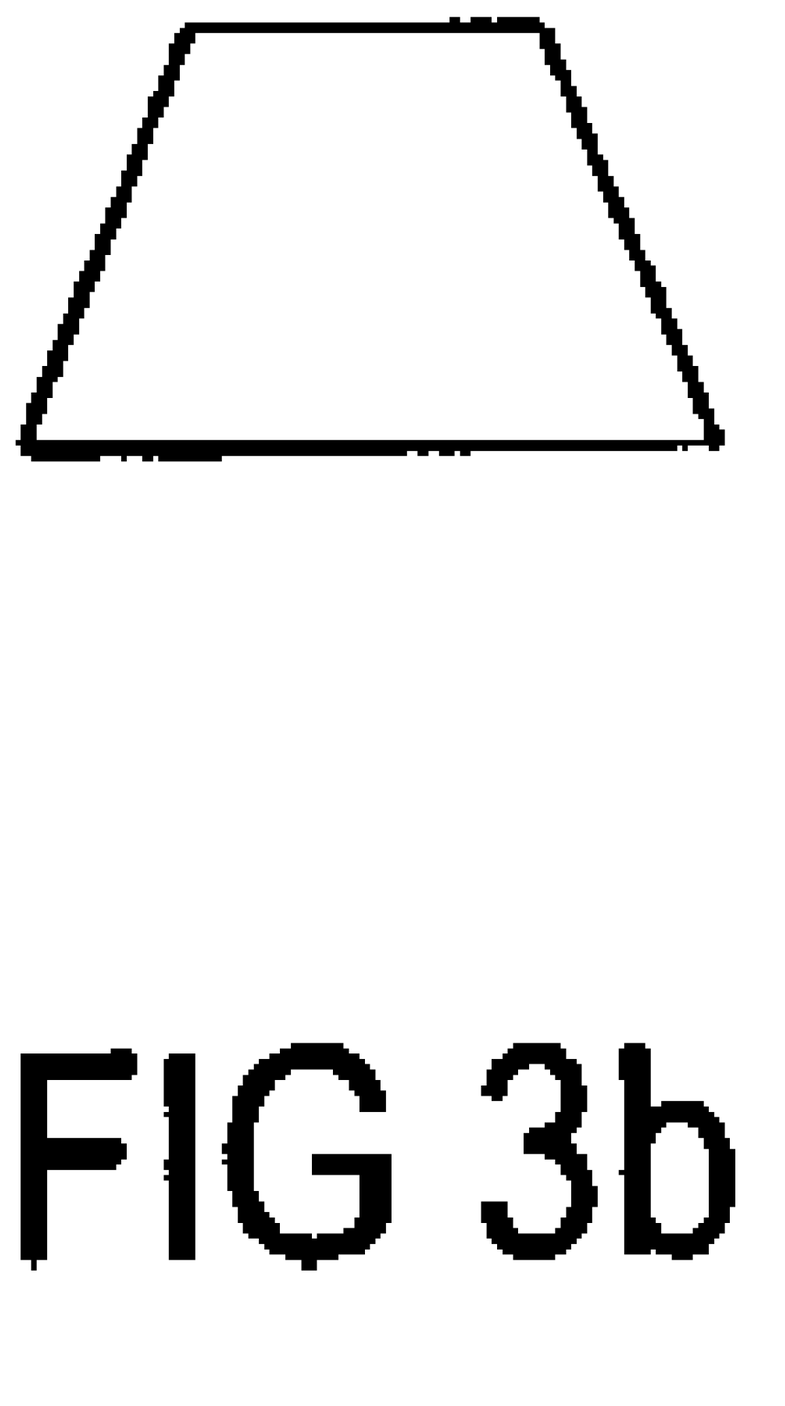
Figure 3C:
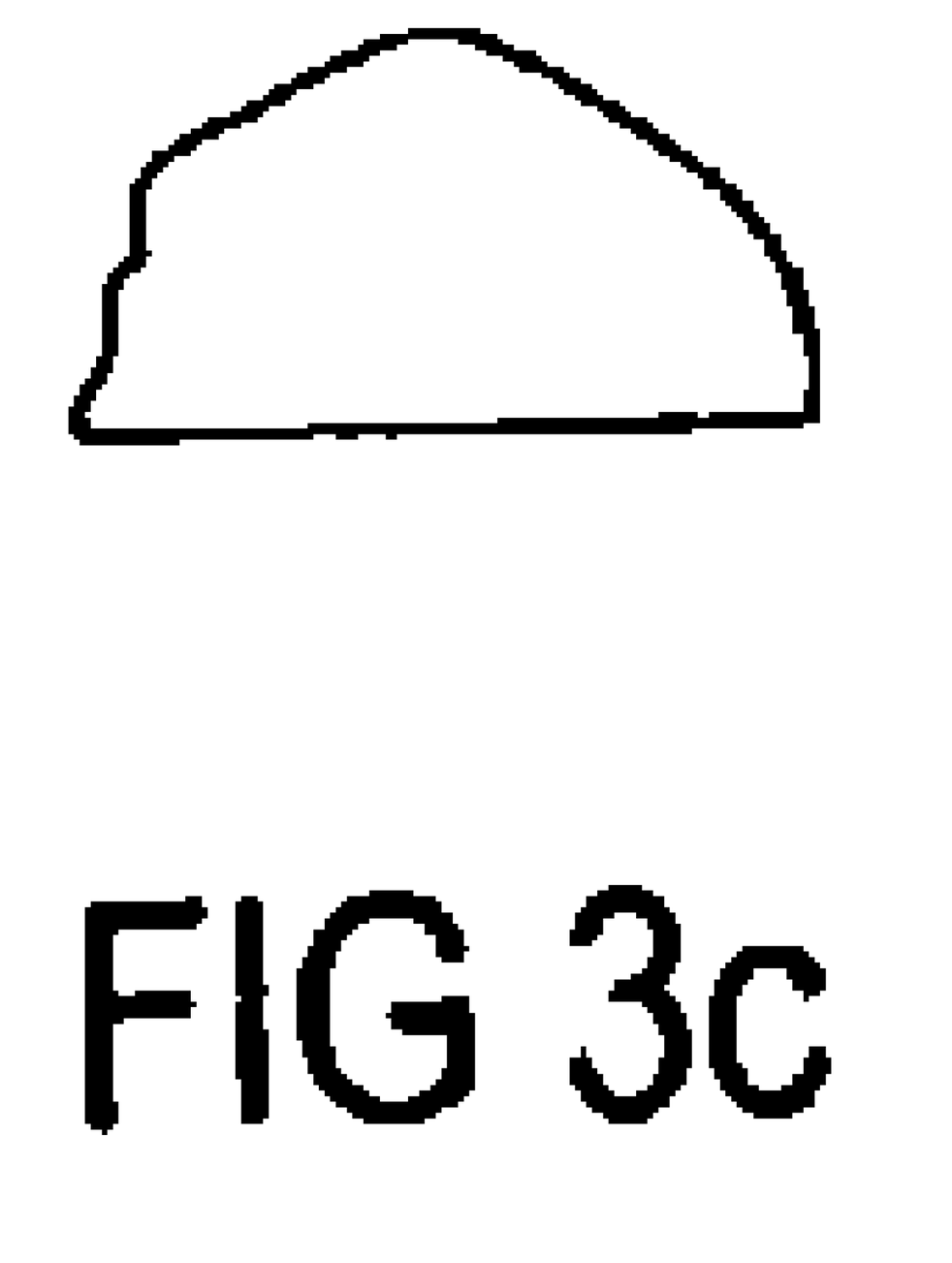
Figure 4:
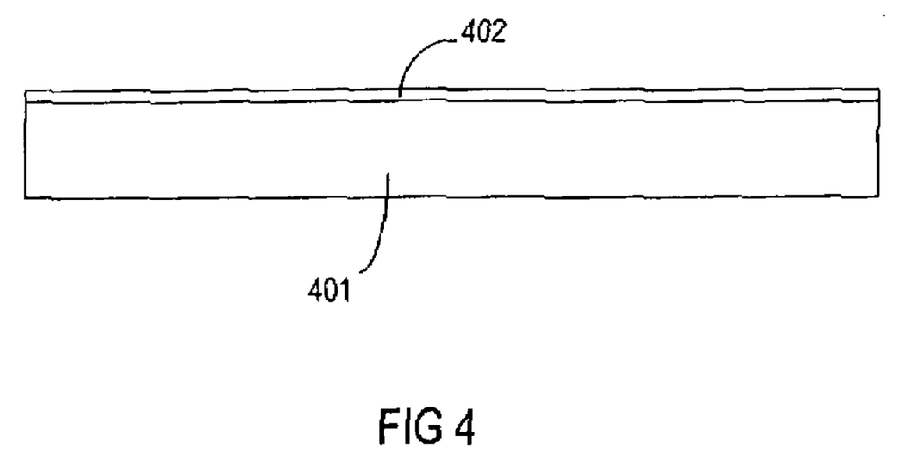
FIGS. 4-8 show a process for forming an OLED device in accordance with one embodiment of the invention.

Referring to FIGS. 3a-c, spacer particles having other geometric shapes, such as pyramidal, cubical, prism, or other regular or irregular shapes, in which the base is at least equal to or wider than the upper portion, are also useful.

FIGS. 4-8 show a process of forming an OLED device, according to one embodiment of the invention. A first conductive layer 402 is deposited on the substrate 401. The substrate can be provided with a barrier layer, such as silicon dioxide ($SiO_2$), beneath the conductive layer on the substrate surface prior to depositing the conductive layer. Barrier layers are particularly useful for substrates comprising soda lime glass. The barrier layer, for example, is about 20 nm thick. Various techniques, such as chemical vapor deposition (CVD), physical vapor deposition (PVD), and plasma enhanced CVD (PECVD), can be employed to form the device layer. The conductive layer should be thin to reduce optical absorption and negative impact on subsequent film formation while satisfying electrical requirements. The conductive layer is typically about 0.02 1µm thick.

Figure 5:
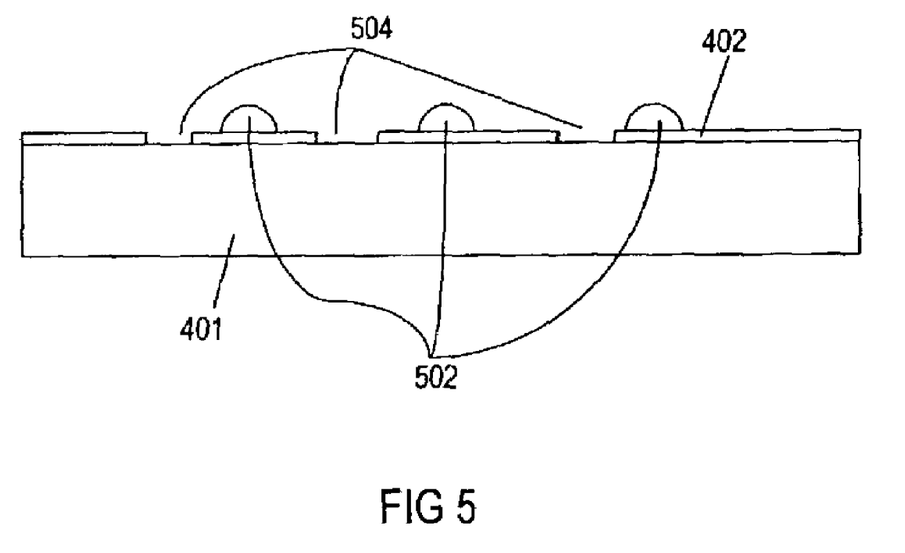

Referring to FIG. 5, the conductive layer 402 is patterned as desired to selectively remove portions of the layer, exposing portions 504 of the substrate. The patterned conductive layer serves as first electrodes for the OLED cells. In one embodiment, the conductive layer is patterned to form strips that serve as, for example, anodes of a pixelated OLED device. The patterning process can also form connections for bond pads. Conventional techniques, such as photolithography and etching, can be used to pattern the conductive layer. Patterning techniques using a stamp are also useful.

In accordance to the invention, shaped spacer particles 502 are deposited on the substrate. The spacer particles, in one embodiment, comprise the desired shape before deposition. Alternatively, the spacer particles are patterned to form the desired shape after being deposited onto the substrate. For example, the particles may be heated to a high temperature to reflow into the desired shape on the substrate. In another embodiment, a photoresist is deposited on the substrate. The photoresist may be patterned to form the spacers with the desired shape.

In one embodiment, the spacer particles are deposited by spraying techniques (e.g. wet or dry spraying). Other techniques, such as spin coating, doctor blading or various printing methods (e.g. screen printing or transfer printing) are also useful.

In a preferred embodiment, a dry spray technique is employed to deposit the spacer particles. Dry spray techniques are described in, for example, Birenda Bahadur (Ed), Liquid Crystals: Applications and Uses, Vol. 1 (ISBN 9810201109), which is incorporated by reference for all purposes. Dry spray techniques typically comprise electrostatically charging the spacer particles with a first polarity (positive or negative) and the substrate with a second polarity (negative or positive). The spacer particles are blown against the substrate with dry air supplied by a dry air sprayer. Dry air sprayers, such as a DISPA-µ R from Nisshin Engineering Co., can be used.

The use of a wet spray technique to deposit the spacer particles on the substrate is also useful. Wet spray techniques are described in, for example, Birenda Bahadur (Ed), Liquid Crystals: Applications and Uses, Vol. 1 (ISBN 9810201109), which is already incorporated by reference for all purposes.

In one embodiment, the spacer particles are randomly distributed on the substrate. The spacer particles occupy both active and non-active parts (i.e., emitting and non-emitting areas) of the device. In another embodiment, the spacer particles are confined to the non-active areas. Various techniques such as photolithography technology can be employed to pattern the coverage of the spacer particles. Alternatively, shadow mask or stencil mask technology can be used. A shadow mask with the required pattern is placed in close proximity or direct contact with the surface before deposition of the spacer particles. During the spray application process, only the regions which are exposed by the mask will be covered with spacer particles. Alternatively, a patterned dry resist film can be laminated on the bare surface. After the spacer particles are deposited, the dry resist film is cured and removed from the surface, leaving the exposed areas covered with spacer particles. A liquid resist material can also be used in a similar manner.

The spacer particles are preferably fixed to one side of the substrate to avoid any movement. In one embodiment, the spacer particles are coated with a thin layer of adhesive before deposition. The adhesive layer comprises, for example, epoxy resin or acrylic resin. In one embodiment, the adhesive is cured by heat treatment. In another embodiment, the adhesive is cured by exposure to ultraviolet radiation. In yet another embodiment, the adhesive comprises a hot melt material.

Figure 6:
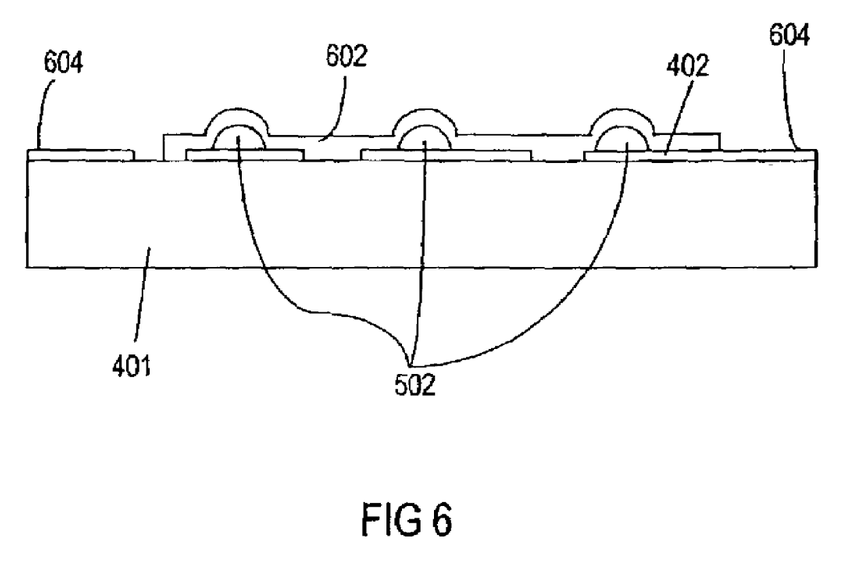

Referring to FIG. 6, one or more organic functional layers 602 are formed on the substrate, covering the spacer particles, the exposed substrate portions and conductive layer. The organic functional layers can be formed by conventional techniques, for example, wet processes such as spin coating or vacuum sublimation (for Alq3 organic layers). Portions of the organic layers can be selectively removed to expose underlying layers in regions 604 for bond pad connections. Selective removal of the organic layers can be achieved using, for example, a polishing process. Other techniques, such as etching, scratching, or laser ablation, are also useful.

Figure 7:
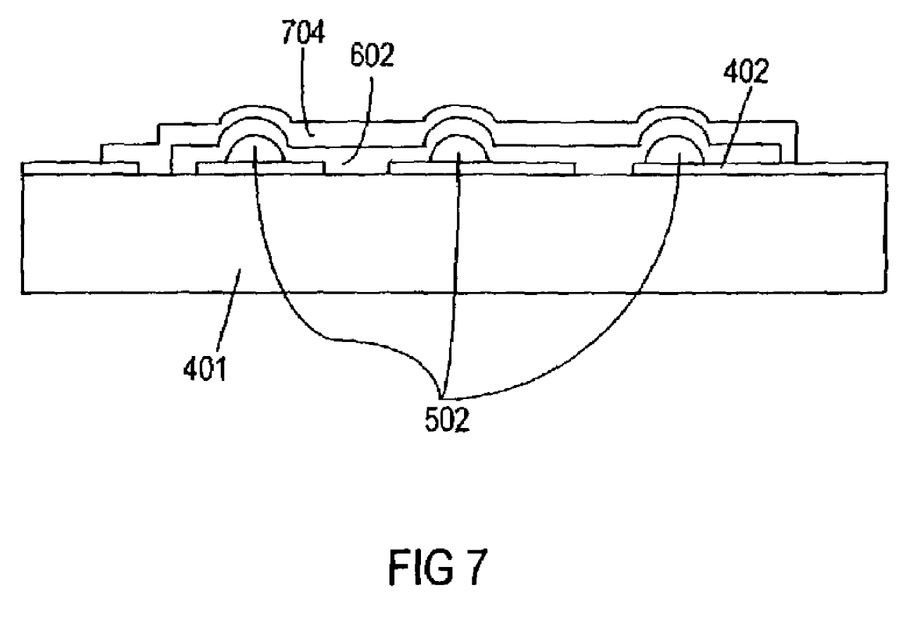

Referring to FIG. 7, a second conductive layer 704 is deposited on the substrate, covering the spacer particles and other layers formed thereon. In one embodiment, the second conductive layer is patterned to form electrode strips that serve as cathodes for a pixelated OLED device. Also, connections for bond pads can be formed during the patterning process. Alternatively, the conductive layer can be selectively deposited to form cathode strips and bond pad connections. Selective deposition of the conductive layer can be achieved with, for example, mask layers. The cathode strips are typically orthogonal to the anode strips. Forming cathode strips that are diagonal to the anode strips is also useful. The intersections of the top and bottom electrode strips form organic LED pixels.

Figure 8:
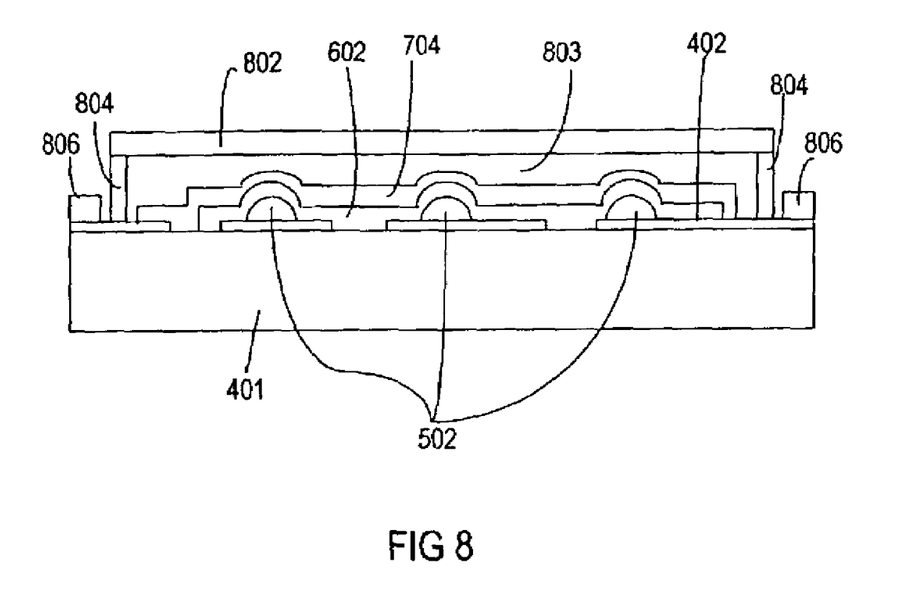

Referring to FIG. 8, a cap 802 is mounted on the substrate to encapsulate the device. The cap creates a cavity 803, providing separation between it and the OLED cells. In one embodiment, a sealing frame 804 surrounding the cell region is prepared. Preparation of the sealing frame includes patterning the substrate, if necessary, to form an area for forming a sealing post 804 therein. Alternatively, the sealing frame can be formed on the cap. The height of the sealing post is sufficient to form a cavity 803 with the desired height. The use of a sealing frame is described in international patent application "Improved Encapsulation of Organic LED Device", PCT/SG00/001 33, which is herein incorporated by reference for all purposes.

The cap layer 802 comprises, for example, metal or glass. Other types of caps which protect the active components from the environment, such as ceramic or metallized foil, are also useful. In yet another embodiment of the invention, the cap can be stamped or etched, depending on the material used, to form a cavity separating the cap and the OLED devices.

Various techniques can be used to mount the cap layer. In one embodiment, an adhesive is used to mount the cap layer. Adhesives such as self-hardening adhesives, UV or thermal curable adhesives, or hot melt adhesives are useful. Other techniques which employ low temperature solder materials, ultrasonic bonding, or welding techniques using inductance or laser welding are also useful.

In one embodiment of the invention, a sealing dam surrounding the device region of the substrate is provided. The sealing dam supports the cap on the substrate and provides a sealing region located at an outer face of the sealing dam. The use of a sealing dam is described in international patent application "Sealing of Electronic Devices", PCT/SG00/00133, which is herein incorporated by reference for all purposes.

During the mounting process, the spacer particles may be pressed into the layers of the OLED cells. The spacer particles provide support for the cap over the area of the OLED cells, preventing the cap from contacting the active components of the device when pressure is applied to the cap. Bond pads 806 are formed to provide electrical access to the OLED cells.

As described, the process deposits the adhesive-coated spacer particles after formation of the first conductive layer. The spacer particles can alternatively be deposited at other points in the process flow. For example, the spacer particles can be deposited before the formation of the first conductive layer, before or after the formation of the second conductive layer. In effect, the spacer particles can be deposited at any point of the process prior to mounting of the cap.

The adhesive on the spacer particles is cured at some point in the process flow after the deposition of the spacer particles. In one embodiment, the adhesive is cured after the spacer particles are deposited on the substrate and before the formation of the organic layers. In another embodiment, the adhesive is cured after the spacer particles are applied to the first active organic layer and before the formation of the remaining layers. In another embodiment, the adhesive is cured after the spacer particles are applied to the second organic layer and before the formation of the remaining layers. In yet another embodiment, the adhesive is cured after the spacer particles are applied to the second conductive layer and before the encapsulation of the OLED device. Spacer particles can also be useful in providing support in other types of devices that employ cavity packages. Such devices include, for example, electrical devices, mechanical devices, electromechanical devices, or microelectromechanical systems (MEMS).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

The invention claimed is:

1. A device comprising:
   a substrate with a device region, wherein the device region comprises one or more cells;
   a cap for encapsulating the device, the cap creating a cavity over the device region; and
   spacer particles on the substrate capable of supporting the cap, the spacer particles comprising a half-spherical shape with a base and an upper portion, the base having a first surface adjacent to the substrate, the first surface having a first width, the first width being wider than the upper portion.

2. The device of claim 1 wherein the spacer particles comprise glass, silica, polymers, ceramic or photoresist.

3. The device of claim 2 wherein the spacer particles comprise an average height to maintain a height of the cavity.

4. The device of claim 2 wherein the spacer particles comprise a density to maintain separation between the cap and the device region.

5. The device of claim 1 wherein the spacer particles comprise an average height to maintain a height of the cavity.

6. The device of claim 1 wherein the spacer particles comprise a density to maintain separation between the cap and the device region.

7. The device of claim 6 wherein the density is about 10-1000 No/mm$^2$.

8. The device of claim 1 wherein an average distance between the spacer particles is about 100-500µm.

9. A device comprising:
   a substrate with a device region, wherein the device region comprises one or more cells;
   a cap for encapsulating the device, the cap creating a cavity over the device region; and
   spacer particles on the substrate capable of supporting the cap, the spacer particles having a half-spherical shape with a base that is wider than an upper portion;
   wherein the cells comprise OLED cells for forming an OLED device.

10. The device of claim 1 or 9 wherein the spacer particles comprise a non-conductive material.

11. The device of claim 10 wherein the spacer particles comprise an average height to maintain a height of the cavity.

12. The device of claim 10 wherein the spacer particles comprise a density to maintain separation between the cap and the device region.

13. The device of claim 9 wherein the spacer particles comprise glass, silica, polymers, ceramic or photoresist.

14. The device of claim 13 wherein the spacer particles comprise an average height to maintain a height of the cavity.

15. The device of claim 13 wherein the spacer particles comprise a density to maintain separation between the cap and the device region.

16. The device of claim 9 wherein the spacer particles comprise an average height to maintain a height of the cavity.

17. The device of claim 9 wherein the spacer particles comprise a density to maintain separation between the cap and the device region.

18. The device of claim 17 wherein the density is about 10-1000 No/mm$^2$.

19. The device of claim 9 wherein an average distance between the spacer particles is about 100-500 µm.

20. A device comprising:
   a substrate with a device region, wherein the device region comprises one or more cells;
   a cap for encapsulating the device, the cap creating a cavity over the device region; and spacer particles on the substrate capable of supporting the cap, the spacer particles comprising a pyramidal, cubical, prism, regular or irregular shape wherein the spacer particles have a base and an upper portion, the base having a first surface adjacent to the substrate, the first surface having a first width, the first width being wider than the upper portion.

21. The device of claim 20 wherein the spacer particles comprise a non-conductive material.

22. The device of claim 21 wherein the spacer particles comprise an average height to maintain a height of the cavity.

23. The device of claim 21 wherein the spacer particles comprise a density to maintain separation between the cap and the device region.

24. The device of claim 20 wherein the spacer particles comprise glass, silica, polymers, ceramic or photoresist.

25. The device of claim 24 wherein the spacer particles comprise a density to maintain separation between the cap and the device region.

26. The device of claim 25 wherein the density is about 10-1000No/mm$^2$.

27. The device of claim 20 wherein an average distance between the spacer particles is about 100-500μm.

28. The device of claim 24 wherein the spacer particles comprise an average height to maintain a height of the cavity.

29. The device of claim 20 wherein the spacer particles comprise an average height to maintain the height of the cavity.

30. The device of claim 20 wherein the spacer particles comprise a density to maintain separation between the cap and the device region.

31. The device of claim 20, wherein the spacer particles have a non-spherical shape.

32. The device of claim 20, wherein the cells comprise OLED cells for forming an OLED device.

33. An organic electrical device comprising:
 a substrate with a device region, wherein the device region comprises one or more cells having one or more organic layers arranged between a lower electrode and an upper electrode in the device region;
 a cap for encapsulating the device, the cap creating a cavity over the device region; and
 spacer particles on the substrate capable of supporting the cap, wherein the spacer particles each comprise a profile having a bottom surface that is flat and is wider than any other portion of the particle.

34. The device of claim 33 wherein the upper electrode covers the spacer particles.

35. The device of claim 33 wherein the one or more organic layers comprise electroluminescent material.

* * * * *